United States Patent
Murthy et al.

(10) Patent No.: US 6,999,533 B2
(45) Date of Patent: Feb. 14, 2006

(54) DEMODULATING ENCODED DATA

(75) Inventors: Chandra R. Murthy, San Jose, CA (US); Serguei A. Glazko, San Diego, CA (US); Christopher C. Riddle, San Diego, CA (US); Angelica Wong, San Francisco, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 441 days.

(21) Appl. No.: 10/000,817

(22) Filed: Nov. 30, 2001

(65) Prior Publication Data

US 2003/0112897 A1    Jun. 19, 2003

(51) Int. Cl.
*H04L 27/06* (2006.01)
(52) U.S. Cl. ..................................................... 375/343
(58) Field of Classification Search ................ 375/343, 375/316, 142, 147, 150
See application file for complete search history.

(56) References Cited

U.S. PATENT DOCUMENTS

| | | | | |
|---|---|---|---|---|
| 5,579,338 A | * | 11/1996 | Kojima | 375/149 |
| 6,515,980 B1 | * | 2/2003 | Bottomley | 370/342 |
| 6,819,707 B1 | * | 11/2004 | Abraham et al. | 375/142 |

OTHER PUBLICATIONS

Webster, et al., "Additional Covercode and Fast Transform Detail", Sep. 1998, IEEE 802.11-98/331, pps 1-20.
Tae-Ho Kim, et al., *A New Architecture of CCK Modem Based on Iterative Differential-Modulation and Phase-Detection*; ICECS 0221 8th IEEE International Conference on Electronics.
VanNee, et al., *OFDM Codes for Peak-to-Average Power Reduction and Error Correction*; IEEE Globecom 1996.
Halford, et al., *Complementary Code Keying for Rake-Based Indoor Wireless Communication*; ISCAS 1999 IEEE.

* cited by examiner

*Primary Examiner*—Tesfaldet Bocure
(74) *Attorney, Agent, or Firm*—Philip R. Wadsworth; Charles D. Brown; Timothy F. Loomis

(57) ABSTRACT

The invention provides the ability to exploit redundancy characteristics of an equation set used to generate waveforms for wireless communication. In doing so, the invention can reduce the number of correlation values that need to be calculated in order to determine the most likely transmitted code word. In particular, the invention can exploit the redundancy characteristics of the equation set in a novel and unique fashion by separating the vector and calculating partial correlations for each separated portion of the vector. The techniques can drastically reduce the number of correlation values that need to be computed for demodulation, and can also reduce the total number of computations. In this manner, the demodulator of a wireless communication device can be simplified without negatively impacting performance.

27 Claims, 6 Drawing Sheets

DEMODULATING ENCODED DATA

FIELD

The invention relates to wireless networking and, more particularly, to demodulation of wireless signals.

BACKGROUND

Wireless networks allow computing devices to share information and resources via wireless communications. Examples of computing devices include laptop or desktop computers, personal digital assistants (PDAs), mobile phones, data terminals, data collection devices, and other portable and non-portable computing devices. One broad family of standards developed to facilitate wireless networking is IEEE 802.11. The original IEEE 802.11 standard provides data transfer rates of 1–2 Megabits per second (Mbps) in a 2.4–2.483 Gigahertz (GHz) frequency band (hereafter the 2.4 GHz band). However, a number of extensions to the original IEEE 802.11 standard have been developed in an effort to increase data transfer rates.

The IEEE 802.11b standard (sometimes referred to as 802.11 wireless fidelity or 802.11 Wi-Fi) is an extension of the IEEE 802.11 standard that provides 11 Mbps transmission (with a fallback to 5.5, 2.0 and 1.0 Mbps) in the 2.4 GHz band. The IEEE 802.11b standard utilizes complimentary code keying (CCK) techniques as an encoding scheme to achieve multi-channel operation in the 2.4 GHz band. Generally, CCK is one type of orthogonal phase modulation scheme that uses complex symbol structures to represent multi-bit codewords. For example, a CCK waveform can be synthesized using the following equation set:

$$\{e^{j(\phi_1+\phi_2+\phi_3+\phi_4)}, e^{j(\phi_1+\phi_3+\phi_4)}, e^{j(\phi_1+\phi_2+\phi_4)}, -e^{j(\phi_1+\phi_4)},$$
$$e^{j(\phi_1+\phi_2+\phi_3)}, e^{j(\phi_1+\phi_3)}, -e^{j(\phi_1+\phi_2)}, e^{j(\phi_1)}\},$$

where phase angles $\phi_1$, $\phi_2$, $\phi_3$ and $\phi_4$ can have values in the set of angles $\{0, \pi/2, \pi, 3\pi/2\}$. The phase angles $\phi_1$, $\phi_2$, $\phi_3$ and $\phi_4$ can each be represented with two bits because there are four possible values that each phase angle can take. Thus, a sequence of 8-data bits uniquely determine the values $\phi_1$, $\phi_2$, $\phi_3$ and $\phi_4$ that are used in the transmitted code-word, with two bits defining the phase angle corresponding to each $\phi$. Given a sequence of 8-data bits, the CCK waveform can be synthesized to convey the encoded data by phase-shift modulation of a signal according to the resulting $\phi_1$, $\phi_2$, $\phi_3$ and $\phi_4$.

Upon receiving the modulated waveform (a vector similar to the transmitted vector above, but corrupted with the channel noise), a demodulator determines $\phi_1$, $\phi_2$, $\phi_3$ and $\phi_4$ to reconstruct the transmitted data bits. More specifically, the demodulator typically cross-correlates the received vector with all possible transmitted code words and selects the code word that yields the highest correlation value to identify the most probable transmitted code word. In particular, a vector representing the received CCK codeword can be cross-correlated with complex conjugates of the possible CCK codewords to generate a set of correlation values. In other words, for a received vector, a respective correlation value can be calculated for each possible CCK code word. Thus, in the case of the 8-bit code word, the demodulator may calculate 256 correlation values.

In order to reduce errors due to interference from channel noise, the CCK encoding scheme introduces data redundancy. In particular, the defined elements of CCK codeword are interdependent in that the values of some of the elements are dependent on the values of other elements.

SUMMARY

In exemplary embodiments, the invention is directed to one or more methods. For example, a method according to the invention may comprise receiving a waveform representing a wireless communication and demodulating the waveform into a vector of encoded data. The method may also comprise calculating partial correlation values for portions of the vector and decoding transmitted data from the vector based on the partial correlation values.

For example, a first set of partial correlation values can be calculated for a first portion of a vector and a second set of partial correlation values can be calculated for a second portion of the vector. A largest correlation value associated with the vector can then be determined based on the calculations of the first and second sets of partial correlation values. By separating the vector into vector portions, redundancy of the equation set can be exploited in a unique manner to reduce the complexity of a demodulator.

In other exemplary embodiments, the invention is directed to a demodulator for a wireless communication device (WCD). For example, the demodulator may include a demodulation unit that demodulates a received waveform representing a wireless communication into a vector of encoded data. The demodulator may also include a first partial correlator that calculates a first set of partial correlation values for a first portion of the vector and a second partial correlator that calculates a second set of partial correlation values for a second portion of the vector. Additionally, the demodulator may include a correlation combiner that determines a largest correlation value associated with the vector based at least in part on the calculations of the first and second sets of partial correlation values.

The invention may be implemented in hardware, software, firmware, or any combination thereof. If implemented in software, the invention may be directed to a computer readable medium carrying program code, that when executed, performs one or more of the methods mentioned above. Also, invention may comprise memory and a processor coupled to the memory that performs one or more of the methods mentioned above.

Additional details of various embodiments are set forth in the accompanying drawings and the description below. Other features, objects and advantages will become apparent from the description and drawings, and from the claims.

DETAILED DESCRIPTION

Figure 1:
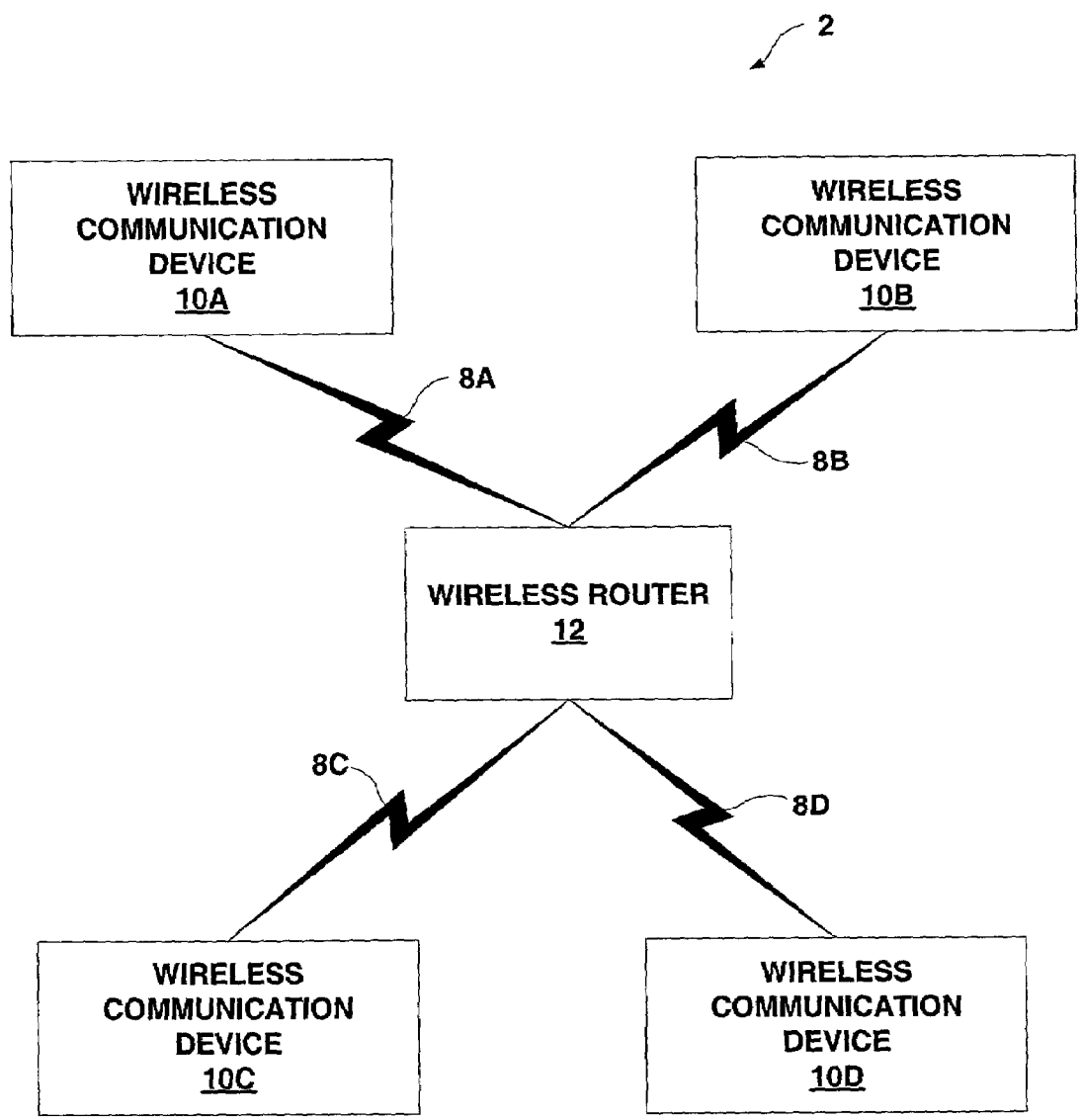
FIG. 1 is a block diagram of an exemplary wireless network according to the invention.

In general, the invention exploits redundancy characteristics of an encoding scheme used to modulate waveforms for wireless communication, such as the CCK encoding scheme commonly used by IEEE 802.11b compliant wireless networks. The CCK encoding scheme, for example, introduces data redundancy in order to reduce errors due to interference from channel noise. In particular, the defined elements of CCK codeword are interdependent in that some of the elements of the codeword are dependent on the values of other elements. Accordingly, a demodulator may make use of this redundancy to simplify demodulation techniques.

More specifically, a demodulator can make use of the invention in order to reduce the number of correlation values that need to be calculated to obtain a complete set of correlation values. For example, the invention can exploit the redundancy characteristics of the equation set in novel fashion by separating the received vector and calculating partial correlations for each separated portion of the received vector. The techniques can drastically reduce the number of correlation values that need to be computed for demodulation, and can also reduce the total number of computations. In this manner, the demodulator of a wireless communication device (WCD) can be simplified without negatively impacting performance.

The invention can provide a number of advantages. In particular, the invention can greatly simplify the demodulator of a wireless communication device. By separating the received vector into vector portions and calculating partial correlation values, the invention facilitates the ability to exploit data redundancy of the encoding scheme in an inventive manner. Doing so can reduce the number of correlation value calculations required to determine the most likely code vector. Moreover, the number of computations (such as comparisons and complex additions) can also be greatly reduced, further simplifying the demodulator. These reductions in demodulator complexity, however, do not affect the performance of the demodulator.

As mentioned, the invention exploits redundancy characteristics of an encoding scheme used to modulate waveforms for wireless communication, such as the CCK encoding scheme commonly used by IEEE 802.11b compliant wireless networks. For example, the CCK equation set:

$$\{e^{j(\phi_1+\phi_2+\phi_3+\phi_4)}, e^{j(\phi_1+\phi_3+\phi_4)}, e^{j(\phi_1+\phi_2+\phi_4)}, -e^{j(\phi_1+\phi_4)},$$
$$e^{j(\phi_1+\phi_2+\phi_3)}, e^{j(\phi_1+\phi_3)}, -e^{j(\phi_1+\phi_2)}, e^{j(\phi_1)}\},$$

can be rewritten as:

$$\{e^{j(\phi_1)}[e^{j(\phi_2+\phi_3+\phi_4)}, e^{j(\phi_3+\phi_4)}, e^{j(\phi_2+\phi_4)}, -e^{j(\phi_4)}, e^{j(\phi_2+\phi_3)},$$
$$e^{j(\phi_3)}, -e^{j(\phi_2)}, 1]\}$$

by factoring out the $e^{j(\phi_1)}$ term. The above equation is a description of the code vector that is transmitted as a waveform by the WCD. At the receiver, a demodulator takes in the transmitted vector corrupted by channel noise and identifies the most likely code vector that was transmitted. This involves cross-correlating the received vector with all possible transmitted vectors, and choosing the vector that yields the largest cross-correlation value. This vector would then be the most likely transmitted code vector, and would result in the lowest decode error rate. Since each of $\phi_1$, $\phi_2$, $\phi_3$ and $\phi_4$ can be one of four possible values, there are a total of $4^4=256$ possible code vectors. Notably, the complete set of 256 real correlation values can be obtained by calculating only 64 complex correlation values associated with a constant $\phi_1=0$. In particular, as $\phi_1$ is varied over the four possible values in the set of angles $\{0, \pi/2, \pi, 3\pi/2\}$, the real part of the complex correlation value is the real- or imaginary-part of the complex correlation with $\phi_1=0$, multiplied by +1 or −1. For this reason, the complete set of 256 real-parts of correlation values can be obtained from the 64 complex correlation values by varying $\phi_1$ without separately calculating the additional correlation values. As described below, the number of correlation computations can be even further reduced by exploiting the structure of the code.

FIG. 1 is a block diagram illustrating a wireless communication system 2 including a number of communication devices 10A–10C, collectively referred to as wireless communication devices 10. Wireless communication devices (WCD) 10 may be any portable computing device configured to support wireless networking. Each device may be, for example, a desktop or portable computer operating in a Windows™, Macintosh™, Unix, or Linux environment, a personal digital assistant (PDA) based on the Palm™, Windows CE, or similar operating system environments for small portable devices, or other wireless device such as a mobile telephone, an interactive television, a wireless data terminal, a wireless data collection device, an Internet kiosk, a network-ready appliance for the home environment, a wireless server, and the like.

WCDs 10 communicate with one another in wireless communication system 2 via wireless signals 8A–8D (hereafter wireless signals 8). In particular, WCDs 10 may communicate according to a wireless protocol such as the protocol defined by the 802.11b standard. Wireless signals 8 may be routed to and from the respective WCDs 10 by wireless router 12. For illustrative purposes, many details of the invention are described below in terms of a complimentary code keying (CCK) encoding scheme often used within wireless networks compliant with the 802.11b standard. However, the invention is not so limited, and may be readily applied to a number of other encoding schemes. In particular, any encoding scheme, including schemes not yet developed, which make use data redundancy may benefit from various aspects of the invention.

The CCK modulation scheme is one example of a modulation scheme that makes use of data keying redundancy. For example, as mentioned above the CCK equation set:

$$\{e^{j(\phi_1+\phi_2+\phi_3+\phi_4)}, e^{j(\phi_1+\phi_3+\phi_4)}, e^{j(\phi_1+\phi_2+\phi_4)}, -e^{j(\phi_1+\phi_4)},$$
$$e^{j(\phi_1+\phi_2+\phi_3)}, e^{j(\phi_1+\phi_3)}, -e^{j(\phi_1+\phi_2)}, e^{j(\phi_1)}\}$$

can be rewritten as $$\{e^{j(\phi_1)}[e^{j(\phi_2+\phi_3+\phi_4)}, e^{j(\phi_3+\phi_4)}, e^{j(\phi_2+\phi_4)}, -e^{j(\phi_4)}, e^{j(\phi_2+\phi_3)},$$
$$e^{j(\phi_3)}, -e^{j(\phi_2)}, 1]\}$$

by factoring out the $e^{j(\phi_1)}$ term. Moreover, additional terms can be factored out of subsets of terms in the equation set. For example, the equation set can also be written as:

$$\{e^{j(\phi_1)}[e^{j(\phi_4)}(e^{j(\phi_2+\phi_3)}, e^{j(\phi_3)}, e^{j(\phi_2)}, -1), e^{j(\phi_2+\phi_3)}, e^{j(\phi_3)},$$
$$-e^{j(\phi_2)}, 1]\}$$

by factoring the $e^{j(\phi_4)}$ out the first four terms. The factoring helps identify the redundancy in the encoding scheme, which can be exploited to simplify demodulation.

As described in detail below, wireless communication devices 10 implement one or more demodulators (not shown in FIG. 1) that can exploit redundancy of the CCK encoding scheme. In particular, as described in detail below, a demodulator generates a stream of data from a received waveform, and represents the demodulated data in vector form, such as an eight-bit vector. The demodulators exploit the data redundancy of the CCK encoding scheme by separating the vector into two or more portions, and calculating correlation values for each portion of the vector.

Figure 2:
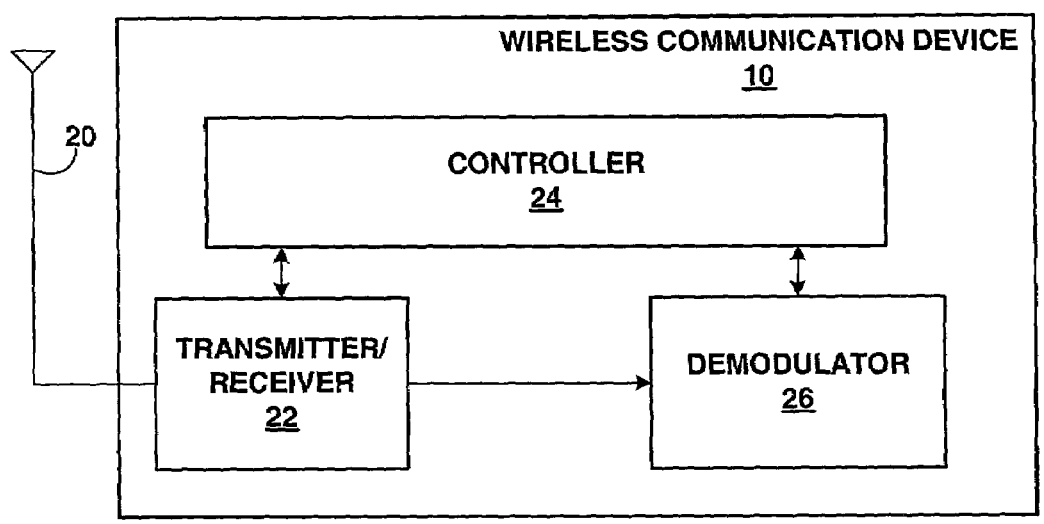
FIG. 2 is a block diagram of an exemplary wireless communication device.

FIG. 2 is a block diagram of an exemplary WCD 10. As shown, WCD 10 includes an antenna 20 coupled to transmitter/receiver 22. Transmitter/receiver 22 receives wireless communications in which data is modulated according to an modulation scheme, such as the CCK modulation scheme typically implemented by devices compliant with the IEEE 802.11b wireless networking standard. Transmitter/receiver 22 typically conditions the received communication, such as by filtering or scaling the waveform, and then passes the waveform to demodulator 26 for demodulation. Controller 24 may send commands to transmitter/receiver 22 and demodulator 26 to control the manipulation of the received waveform.

Demodulator 26 demodulates the received waveform to produce a stream of data that may be represented as vectors of data elements. For each vector, demodulator 26 identifies a most probable codeword. In particular, demodulator 26 implements the demodulation techniques described below to exploit data redundancy in the modulation scheme. In this manner, demodulator 26 may be of lower complexity and may perform fewer computations than conventional demodulators. For example, demodulator 26 may separate each vector into two or more portions, and calculate correlation values for the different portions of the vector. This technique allows demodulator 26 to exploit redundancy in the CCK equations in order to generate all of the correlation values for the vector using a significantly reduced number of computations.

Conventionally, a demodulator cross-correlates all of the elements of the vector with the complex conjugates of every possible codeword to identify the most probable codeword associated with the received waveform. For example, in CCK modulation, the received data stream can be represented as a received vector (rv) as follows:

$$rv=[rv_0, rv_1, \ldots rv_7]=[C_0, C_1, \ldots C_7]+[N_0, N_1, \ldots N_7],$$

where $[C_0, C_1, \ldots C_7]$ represent the modulated codeword to be transmitted and $[N_0, N_1, \ldots N_7]$ represent independent and identically distributed (IID) circularly symmetric complex white Gaussian noise (ignoring channel gain/rotation for simplicity).

In CCK demodulation, demodulator 26 can generate the complete set of possible code words by assigning the four phase angles $\phi1$, $\phi2$, $\phi3$ and $\phi4$ to each unique combination of values in the set of angles $\{0, \pi/2, \pi, 3\pi/2\}$. In particular, demodulator 26 can cross-correlate vector rv with the complex conjugates of the possible code words. Demodulator 26 selects the code word that produces the largest correlation value, which identifies the most probable CCK codeword associated with the received waveform.

Demodulator 26, however, can be implemented in a manner that avoids the need to explicitly calculate every cross-correlation by recognizing and exploiting redundancy in the CCK encoding scheme. In particular, the invention can separate the received vector into two or more vector portions and calculate cross-correlations for the vector portions. As mentioned, separating the vector into vector portions allows demodulator 26 to exploit redundancy in a manner that can greatly simplify the demodulator.

Figure 3:
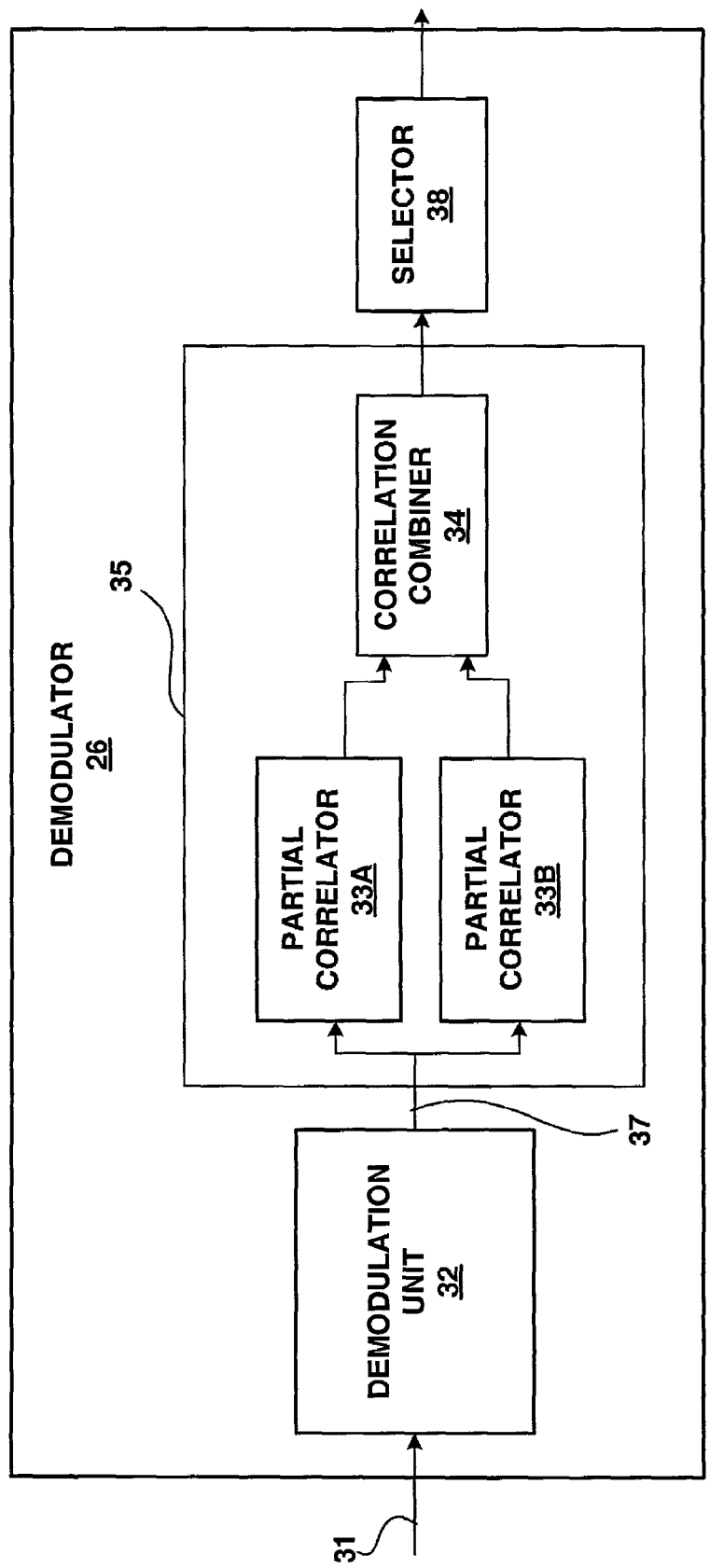
FIG. 3 is a block diagram illustrating in greater detail one embodiment of a demodulator.

FIG. 3 is a block diagram illustrating in greater detail one embodiment of demodulator 26. In particular, demodulator 26 receives an incoming signal 31 representing a received wireless communication. Demodulation unit 32 demodulates the phase-modulated signal 31 to produce a stream 37 of CCK encoded data. In one embodiment, for example, demodulation unit 32 produces a stream of complex data represented as an eight dimensional vector.

Correlation unit 35 receives the vectors from demodulation unit 32. More specifically, partial correlators 33A and 33B within correlation unit 35 receive the vectors from demodulation unit 32 and perform partial correlations on different portions of the vectors. For example, in one embodiment, partial correlator 33A performs partial correlations on the left-most four elements of an eight-element received vector, and partial correlator 33B perform partial correlations on the right-most four elements of the eight-element received vector. In that case, each partial correlator 33A and 33B would perform correlations on four-element vectors. In other embodiments, any number of partial correlators may be used.

Each partial correlator 33 exploits redundancy in the CCK encoding scheme to generate the possible correlation values for the received vector. Given a four-element vector portion, for example, $4^2=16$ possible partial waveform components exist that can be cross-correlated with the four-element vector. This way, each partial correlator 33 exploits the encoding redundancy of the CCK scheme and calculates 16 partial complex correlation values. Specifically, the outputs of the partial correlators 33 can be used to derive the remaining correlation values based on the signs in the calculated partial correlation values and the magnitudes of the real and imaginary components of the calculated partial correlation value. Additional details are described below.

Correlation combiner 34 calculates a final set of correlation values associated with the received vector based on the calculated partial correlation values from partial correlators 33. In particular, correlation combiner 34 may combine pairs of partial correlations from the partial correlators 33 to obtain a set of combined correlations. Moreover, correlation combiner 34 can use information provided by partial correlators 33 regarding the signs and magnitudes of the complex components of the partial correlation values to efficiently calculate the set of combined correlation values associated with the received vector.

Finally, selector 38 selects the most probable transmitted code word associated with the received waveform based on the combined correlation values received from correlation combiner 34, by choosing the code word that yielded the largest correlation value.

Figure 4:
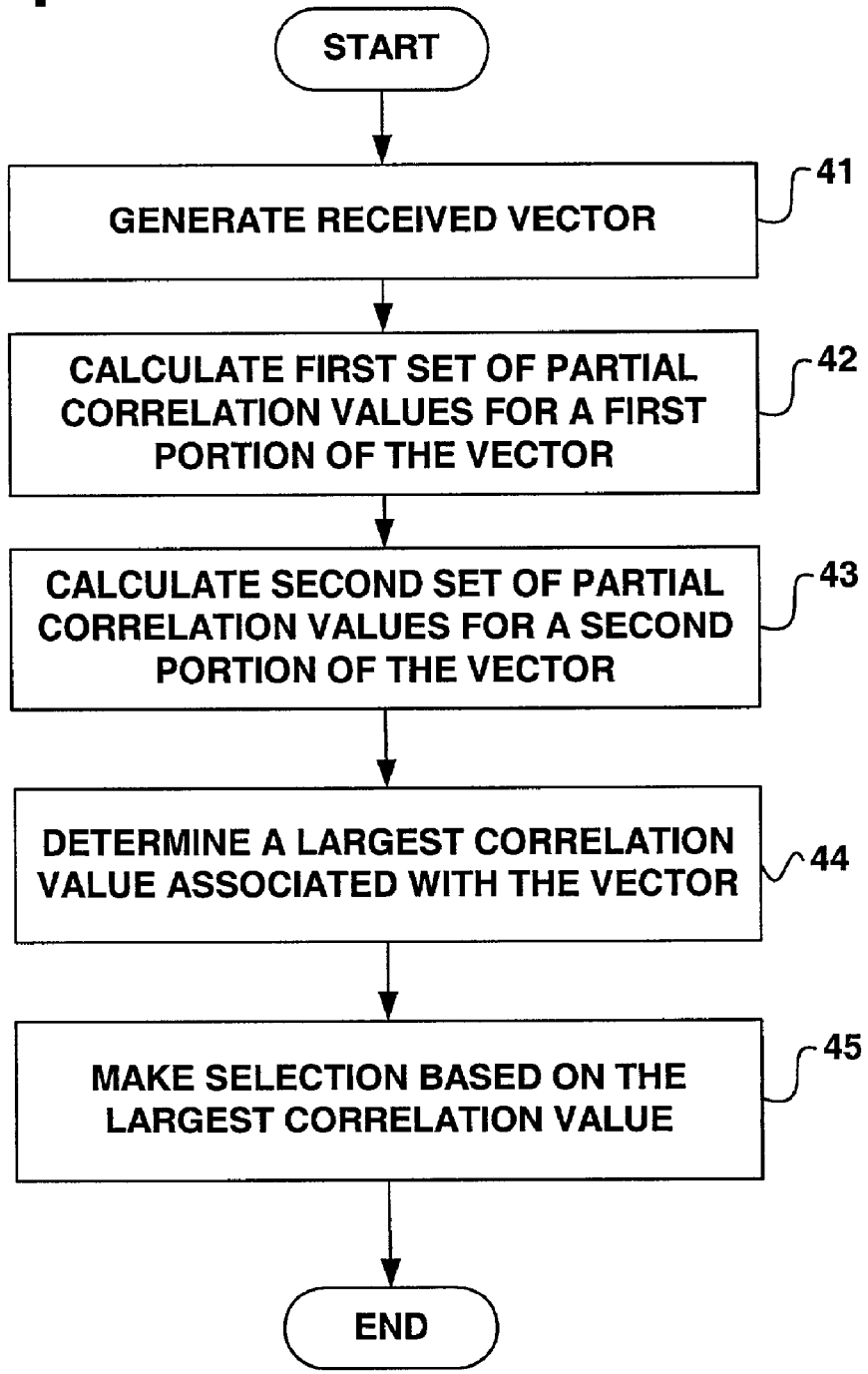
FIG. 4 is a flow diagram according to an embodiment of the invention.

FIG. 4 is a flow diagram illustrating a method according to an embodiment of the invention. As shown, demodulator 26 generates a vector (41). For example, demodulation unit 32 can generate an eight-element vector for CCK waveform that includes noise. Partial correlator 33A calculates a first set of partial correlation values for a first portion of the vector (42). Additionally, partial correlator 33B calculates a second set of partial correlation values for a second portion of the vector (43). In one particular example, the first and second portions of the vector comprise four-element vectors representing the left and right portions of the eight-element received vector. Moreover, in calculating the sets of partial correlations, the partial correlators 33 may calculate subsets of a total number of possible partial correlation values. In that case, redundancy can be exploited to reduce complexity in demodulator 26. In other cases, the partial correlators 33 may calculate all of the possible partial correlation values for each respective portion of the vector.

After the first and second sets of partial correlation values have been calculated, correlation combiner 34 determines a largest correlation value associated with the received vector based at least in part on the calculations of the first and second sets of partial correlation values (44). In particular, correlation combiner 34 may use pairs of partial correlations from the respective partial correlators 33 to determine the largest correlation value associated with the received vector.

Selector 38 can then select the most probable code word associated with the received vector based on the largest correlation value (45).

Figure 5:
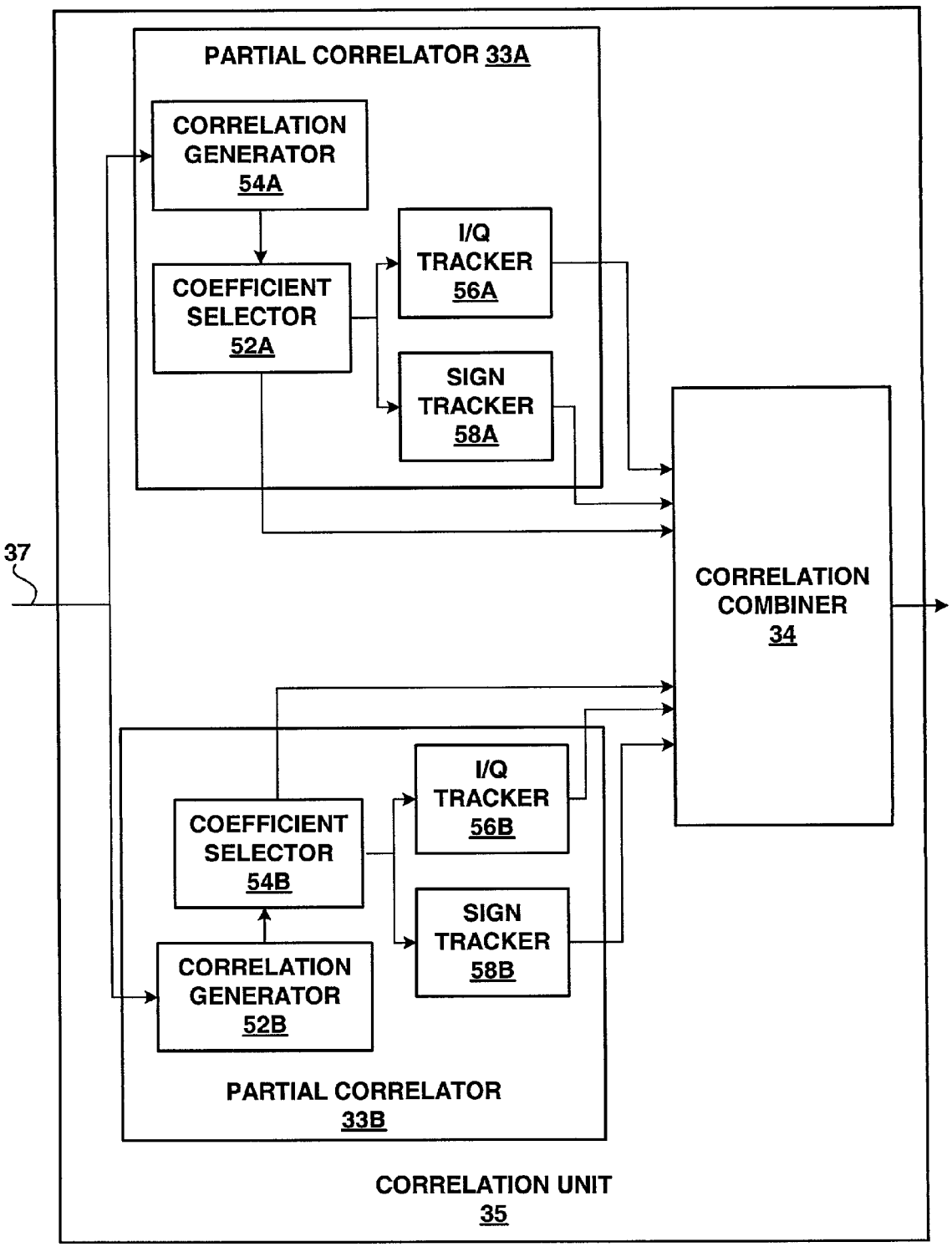
FIG. 5 is a more detailed block diagram of one embodiment of a correlation unit within a demodulator according to the invention.

FIG. 5 is a more detailed block diagram of one embodiment of correlation unit 35 within demodulator 26 according to the invention. Correlation unit 35 receives a vector as input (indicated at 37), for example, generated from demodulation unit 32 as illustrated in FIG. 3. Correlation unit 35 includes at least two partial correlators 33A and 33B that perform partial correlations on different portions of the received vector. Each partial correlator 33 performs correlations on a portion of the received vector.

For example, partial correlator 33A may perform correlations on the first four elements, e.g., the left side, of the received vector. In that case, correlation generator 54A within partial correlator 33A cross-correlates the left side four-element vector with the complex conjugate of the left sides of possible code words. In some cases, correlation generator 54A can generate all possible partial correlations. However, to simplify complexity in the demodulator 26, redundancy can be exploited such that correlation generator 54A only needs to calculate a subset of the total number of possible partial correlations.

Coefficient selector 52A examines the coefficients of the calculated partial correlation values and for each value selects the coefficient having the largest coefficient magnitude, i.e., the largest absolute value. For each correlation value, I/Q tracker 56A stores an indication whether the selected coefficient corresponds to a real or an imaginary component. Also, for each correlation value, sign tracker 58A stores an indication of the sign associated with the selected coefficient. The components of partial correlator 33B operate in a similar manner, but operate on a different portion of the received vector, e.g., the right-most four elements of the eight element received vector.

Correlation combiner 34 examines pairs of partial correlation values from the respective partial correlators 33. Correlation combiner 54 then identifies the pair having a greatest combined largest coefficient magnitude. In other words, for each pair, correlation combiner 54 sums absolute values of the coefficients selected by coefficient selectors 52. Using this sum of maximum coefficients for the identified pair, along with the signs associated with the identified pair (provided from sign trackers 58), and an indication as to whether the coefficients in the identified pair correspond to real or imaginary components (provided by I/Q trackers 56), correlation combiner 34 can determine a largest correlation value for the received vector.

Mathematically, one particular implementation of the invention can be explained as follows. The possible waveforms can be represented as:

$$C = \exp(j\phi 1)[\exp(j\phi 4)V0, V1] = [rv_0, rv_1, \ldots rv_7],$$

where $V0$ and $V1$ are 4-element complex vectors.

The received vector can also be written as:

$$rv = [L, R],$$

where $L$ and $R$ are 4-element complex vectors, and are the left and right halves of the received 8-dimensional vector.

Partial correlator 33A calculates left-partial correlations of the received vector as follows:

$$LPcor_0 = L \times C_0[0:3]^*;\ LPcor_1 = L \times C_1[0:3]^*;\ \ldots,$$
$$LPcor_{15} = L \times C_{15}[0:3]^*$$

Similarly, Partial correlator 33B calculates right-partial correlations of the received vector as follows:

$$RPcor_0 = R \times C_0[4:7]^*;\ RPcor_1 = R \times C_1[4:7]^*;\ \ldots,$$
$$RPcor_{15} = R \times C_{15}[4:7]^*$$

Thus, $$LPcor_0 = LPI_0 + jLPQ_0;\ LPcor_1 = LPI_1 + jLPQ_1;\ \ldots;$$
$$LPcor_{15} = LPI_{15} + jLPQ_{15};$$

and $$RPcor_0 = RPI_0 + jRPQ_0;\ RPcor_1 = RPI_1 + jRPQ_1;\ \ldots;$$
$$RPcor_{15} = RPI_{15} + jRPQ_{15};$$

Here, $C_0$ through $C_{15}$ are the code words obtained by choosing all possible values for $\phi 2$ and $\phi 3$ from the set $\{0, \pi/2, \pi, 3\pi/2\}$. $\phi 2$ and $\phi 3$ can be one of four values, giving $4^2 = 16$ possible code words. The notation $C_0 [0:3]$ represents the left-most four elements of the eight dimensional vector $C_0$. The * denotes complex conjugation. $LPcor_j$ is the $j^{th}$ left partial complex correlation value. $LPI_j$ is the real part of the $j^{th}$ left partial complex correlation, and $LPQ_j$ is the imaginary part of the $j^{th}$ left partial complex correlation.

For each ($LPcor\_k$, $RPcor\_k$) pair, correlation combiner 34 determines:

$$a = \max(|LPI\_k|, |LPQ\_k|),\ \text{and}$$

$$b = \max(|RPI\_k|, |RPQ\_k|).$$

Correlation combiner 34 can then identify:

$$cor\_k = a + b$$

as the largest correlation obtainable by varying $\phi 1$ and $\phi 4$. Thus, the combined correlation values for the 16 possible values of k can be compared and the largest correlation value can be chosen. The value of k defines the values of $\phi 2$ and $\phi 3$, while $\phi 1$ and $\phi 4$ can be easily identified, such as by using a look-up table (LUT).

For example, correlation combiner 34 may implement a LUT using the following four bits:

bit0=1 if ($a==|LPI|$) and 0 otherwise (e.g., if ($a==|LPQ|$));

bit1=(sign($LPI$)+1)/2 if ($a==|LPI|$) and (sign($LPQ$)+1)/2 otherwise;

bit2=1 if ($b==|RPI|$) and 0 otherwise (e.g., if ($b==|RPQ|$);

bit3=(sign($RPI$)+1)/2 if ($b==|RPI|$) and =(sign($RPQ$)+1)/2 otherwise.

The signs and real or imaginary nature of the coefficients can be provided by sign trackers 58 and I/Q trackers 56.

The implementation can work because, the correlation value is:

$$cor = Re(\exp(-j\phi 1)(\exp(-j\phi 4))(LPI\_k + jLPQ\_k) + (RPI\_k + jRPQ\_k)))$$

Thus, as $\phi 4$ is varied:

$xcor_0 = LPI\_k + RPI\_k + j(LPQ\_k + RPQ\_k);$ when $\phi 4 = 0;$ $xcor_1 = LPQ\_k + RPI\_k + j(-LPI\_k + RPQ\_k);$ when $\phi 4 = \pi/2;$ $xcor_2 = -LPI\_k + RPI\_k + j(-LPQ\_k + RPQ\_k);$ when $\phi 4 = \pi;$ $xcor_3 = -LPQ\_k + RPI\_k + j(LPI\_k + RPQ\_k);$ when $\phi 4 = 3^*\pi/2.$ Tables 1 and 2 illustrate exemplary computations.

TABLE 1

$\phi2$ table: Sums for all $\phi2$ values: rv = [$rv_0$, $rv_1$, ... $rv_7$]

| $\phi2 = 0$ | $\pi/2$ | $\pi$ | $3\pi/2$ |
|---|---|---|---|
| $\alpha_0 = rv_0 \times \exp(-j0) + rv_1$ | $\alpha_4 = rv_0 \times \exp(-j\pi/2) + rv_1$ | $\alpha_8 = rv_0 \times \exp(-j\pi) + rv_1$ | $\alpha_{12} = rv_0 \times \exp(-j3\pi/2) + rv_1$ |
| $\alpha_1 = rv_2 \times \exp(-j0) + rv_3$ | $\alpha_5 = rv_2 \times \exp(-j\pi/2) + rv_3$ | $\alpha_9 = rv_2 \times \exp(-j\pi) + rv_3$ | $\alpha_{13} = rv_2 \times \exp(-j3\pi/2) + rv_3$ |
| $\alpha_2 = rv_4 \times \exp(-j0) + rv_5$ | $\alpha_6 = rv_4 \times \exp(-j\pi/2) + rv_5$ | $\alpha_{10} = rv_4 \times \exp(-j\pi) + rv_5$ | $\alpha_{14} = rv_4 \times \exp(-j3\pi/2) + rv_5$ |
| $\alpha_3 = rv_6 \times \exp(-j0) + rv_7$ | $\alpha_7 = rv_6 \times \exp(-j\pi/2) + rv_7$ | $\alpha_{11} = rv_6 \exp(-j\pi) + rv_7$ | $\alpha_{15} = rv_6 \times \exp(-j3\pi/2) + rv_7$ |

TABLE 2

Computing the left and right partial complex correlations

| $\phi_3 = 0$ | $\pi/2$ | $\pi$ | $3\pi/2$ |
|---|---|---|---|
| $LP_0 = \alpha_0 \times \exp(-j0) + \alpha_1$ | $LP_4 = \alpha_0 \times \exp(-j\pi/2) + \alpha_1$ | $LP_8 = \alpha_0 \times \exp(-j\pi) + \alpha_1$ | $LP_{12} = \alpha_0 \times \exp(-j3\pi/2) + \alpha_1$ |
| $RP_0 = \alpha_2 \times \exp(-j0) + \alpha_3$ | $RP_4 = \alpha_2 \times \exp(-j\pi/2) + \alpha_3$ | $RP_4 = \alpha_2 \times \exp(-j\pi) + \alpha_3$ | $RP_4 = \alpha_2 \times \exp(-j3\pi/2) + \alpha_3$ |
| $LP_1 = \alpha_4 \times \exp(-j0) + \alpha_5$ | $LP_5 = \alpha_4 \times \exp(j\pi/2) + \alpha_5$ | $LP_9 = \alpha_4 \times \exp(-j\pi) + \alpha_5$ | $LP_{13} = \alpha_4 \times \exp(-j3\pi/2) + \alpha_5$ |
| $RP_1 = \alpha_6 \times \exp(-j0) + \alpha_7$ | $RP_5 = \alpha_6 \times \exp(-j\pi/2) + \alpha_7$ | $RP_9 = \alpha_6 \times \exp(-j\pi) + \alpha_7$ | $RP_{13} = \alpha_6 \times \exp(-j3\pi/2) + \alpha_7$ |
| $LP_2 = \alpha_8 \times \exp(-j0) + \alpha_9$ | $LP_6 = \alpha_8 \times \exp(-j\pi/2) + \alpha_9$ | $LP_{10} = \alpha_8 \times \exp(-j\pi) + \alpha_9$ | $LP_{14} = \alpha_8 \times \exp(-j32\pi/2) + \alpha_9$ |
| $RP_2 = \alpha_{10} \times \exp(-j0) + \alpha_{11}$ | $RP_6 = \alpha_{10} \times \exp(-j\pi/2) + \alpha_{11}$ | $RP_{10} = \alpha_{10} \times \exp(-j\pi) + \alpha_{11}$ | $RP_{14} = \alpha_{10} \times \exp(-j3\pi/2) + \alpha_{11}$ |
| $LP_3 = \alpha_{12} \times \exp(-j0) + \alpha_{13}$ | $LP_7 = \alpha_{12} \times \exp(-j\pi/2) + \alpha_{13}$ | $LP_{11} = \alpha_{12} \times \exp(-j\pi) + \alpha_{13}$ | $LP_{15} = \alpha_{12} \times \exp(-j3\pi/2) + \alpha_{13}$ |
| $RP_3 = \alpha_{14} \times \exp(-j0) + \alpha_{15}$ | $RP_7 = \alpha_{14} \times \exp(-j\pi/2) + \alpha_{15}$ | $RP_{11} = \alpha_{14} \times \exp(-j\pi) + \alpha_{15}$ | $RP_{15} = \alpha_{14} \times \exp(-j3\pi/2) + \alpha_{15}$ |

As $\phi1$ varies between the values 0, $\pi/2$, $\pi$, $3*\pi/2$, the real/imaginary parts can be chosen and with +/− sign of each of $xcor_0$, $xcor_1$, $xcor_2$ and $xcor_3$. Thus, the maximum value for the correlation would be:

max(|LPI_k|, |LPQ_k|)+max(|RPI_k|, |RPQ_k|), which is the same as the maximum correlation returned if conventional methods of calculating all 256 cross-correlation values for the received eight-element vector are used.

Advantageously, the invention can identify the largest correlation value for the received vector using a reduced number of computations. In particular, the above example would require only 64 complex additions. Moreover the size of comparators may be reduced since comparisons involve only absolute value comparisons. Also, the number of comparisons required in the above example is only:

2*16+16=48 to find the largest correlation.

Additionally, to implement a demodulator according to the invention, only 32 partial complex correlations may be required. Moreover, the 32 partial complex correlations are related and can be implemented using just 56 complex addition operations. In other words, given the received vector:

rv=[$rv_0$, ..., $rv_7$], 32 partial cross-correlations can be calculated using the first 16 waveforms. Also, given a particular value of $\phi2$, the values:

$rv_0 \times \exp(-j\phi2)+rv_1$, $rv_2 \times \exp(-j\phi2)+rv_3$, $rv_4 \times \exp(-j\phi2)+rv_5$, $rv_6 \times \exp(-j\phi2)+rv_7$ do not depend on $\phi3$, so they can be computed once for all values of $\phi3$. This relationship is illustrated in TABLE 1.

Figure 6:
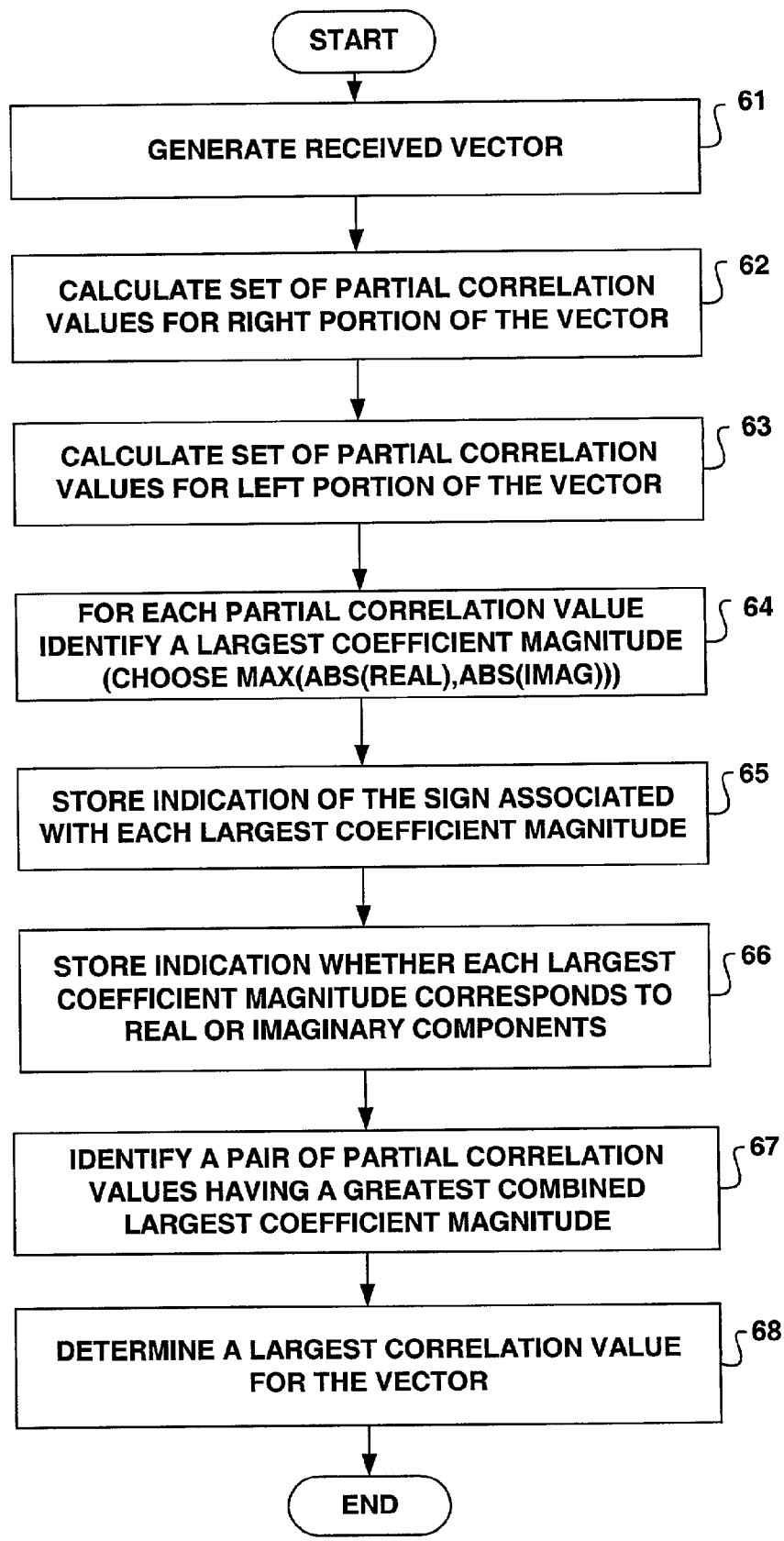
FIG. 6 is another flow diagram according to an embodiment of the invention.

FIG. 6 is another flow diagram according to an embodiment of the invention. As shown, demodulator 26 generates a vector (61). Again, although the invention is not limited in this respect, in one particular example conforming to the 802.11b standard, the generated vector is an eight-element vector generated from a received CCK waveform and including noise. Correlation generator 54A calculates a first set of partial correlation values for a first portion of the vector, such as the right portion (62). Additionally, correlation generator 54A calculates a second set of partial correlation values for a second portion of the vector, such as the left portion (63). For each partial correlation value, coefficient selectors 52 identify a largest coefficient magnitude (64). In particular, coefficient selector 52A selects the largest coefficient magnitudes within correlation values calculated by correlation generator 54A, and coefficient selector 52B selects the largest coefficient magnitudes within correlation values calculated by correlation generator 54B. In other words, for each calculated correlation value coefficient selectors 52 identify whether the real or imaginary component has the largest magnitude.

For each largest coefficient magnitude identified by coefficient selectors 52, sign trackers 58 store an indication of the sign associated with the identified coefficient magnitudes (65). In other words, sign trackers 58 track whether the identified coefficient magnitudes are positive or negative. Also, for each largest coefficient magnitude identified by coefficient selectors 52, I/Q trackers 56 store an indication of whether the identified largest coefficient magnitude corresponds to a real or imaginary component (66). In other words, for each largest coefficient magnitude, I/Q trackers 56 track whether the largest coefficient magnitude was a coefficient of a I component (real component) or a Q component (imaginary component).

Correlation combiner 34 manipulates input received from partial correlators 33 to calculate the largest correlation value for the received vector. In particular, correlation combiner receives data from coefficient selectors 54, I/Q trackers 56 and sign trackers 58 for each partial correlation value generated by correlation generators 54. The partial correlation values generated by correlation generators 54 can be grouped into pairs, with one element of each pair corresponding to a partial correlation value generated by one of the correlation generators. Correlation combiner 34 adds the pairs of partial correlations together and identifies a pair of partial correlation values having a greatest combined largest correlation (67). In other words, correlation combiner 34 compares the combined correlation coefficients for every pair of correlation values generated by the partial correlation generators and identifies the pair having the greatest combined correlation coefficient. Correlation combiner 34 can thus calculate the largest correlation value for the received vector based on the identified pair, signs associated with the largest coefficient magnitudes of the partial correlation values in the identified pair, and whether each of the largest coefficient magnitudes of the partial correlation values in the identified pair correspond to real or imaginary components (68).

A number of embodiments of the invention have been described. In particular, the demodulation techniques have been described as being implemented in hardware. The techniques, however, could alternatively be implemented in software, firmware or any combination of hardware and software. If implemented in software, the techniques may be embodied in program code initially stored on a computer readable medium such as a hard drive or magnetic, optical, magneto-optic, phase-change, or other disk or tape media. For example, the program code can be loaded into memory and then executed in a processor. Alternatively, the program code may be loaded into memory from electronic computer-readable media such as EEPROM, or downloaded over a network connection. If downloaded, the program code may be initially embedded in a carrier wave or otherwise transmitted on an electromagnetic signal. The program code may be embodied as a feature in a program providing a wide range of functionality.

If the invention is implemented in program code, the processor that executes the program code may take the form of a microprocessor and can be integrated with or form part of a WCD. The memory may include random access memory (RAM) storing program code that is accessed and executed by a processor to carry out the various techniques described above. In that case, the invention may comprise a system including memory and a processor coupled to the memory that executes instructions to perform one or more of the demodulation techniques described above.

Exemplary hardware implementations may include implementations within a DSP, an application specific integrated circuit (ASIC), a field programmable gate array (FPGA), a programmable logic device, specifically designed hardware components, or any combination thereof.

The demodulation techniques have been described for use in a WCD such as a desktop, laptop, or portable computer, a personal digital assistant (PDA), or other wireless device such as a mobile telephone, an interactive television, a wireless data terminal, a wireless data collection device, an Internet kiosk, a network-ready appliance for the home environment, a wireless router, a wireless server and the like. Many aspects of the invention have been described as being carried out in a demodulator of a WCD conforming to the 802.11b standard. In that case, CCK would be the modulation scheme. The invention, however, may be implemented with any of a variety of different standards, including standards not yet developed. In particular, the invention can greatly simplify the demodulator of a WCD conforming to any standard that has redundancy in data encoding scheme. Depending on the standard, the received vector may include any number of elements. As more elements are included in the received vector, such as according to future standards, more partial correlators may be advantageous.

Additionally, although wireless devices conforming to the 802.11b standard generally do not implement RAKE receivers, future standards having redundant wave forms may incorporate RAKE receiver technology to track multi-path signals. In that case, the invention may be implemented as part of each demodulator (or demodulation finger) of the RAKE receiver. Accordingly, various other modifications may be made without departing from the spirit and scope of the invention and these modifications and other embodiments are within the scope of the following claims.

What is claimed is:

1. A method comprising:
receiving a waveform representing a wireless communication;
demodulating the waveform into a vector of encoded data;
calculating a first set of partial correlation values for a first portion of a vector against a first set of complex conjugates of first portions of a plurality of possible code words; and
calculating a second set of partial correlation values for a second portion of the vector against a second set of complex conjugates of second portions of the plurality of possible code words; and
decoding transmitted data from the vector based on the partial correlation values, wherein decoding the transmitted data for the vector comprises calculating a largest correlation value associated with the vector based at least in part on the calculations of the first and second sets of partial correlation values and selecting a most probable code word associated with the largest correlation value.

2. The method of claim 1, wherein the first set is a subset of a total number of possible correlation values for the first portion of the vector, and the second set is a subset of a total number of possible correlation values for the second portion of the vector.

3. The method of claim 1, wherein the vector represents decoded data from a waveform having redundancy characteristics.

4. The method of claim 3, wherein the waveform is a complimentary code keying (CCK) waveform for an IEEE 802.11b standard synthesized from a CCK equation set:
$\{e^{j(\phi1+\phi2+\phi3+\phi4)}, e^{j(\phi1+\phi3+\phi4)}, e^{j(\phi1+\phi2+\phi4)}, -e^{j(\phi1+\phi4)}, e^{j(\phi1+\phi2+\phi3)}, e^{j(\phi1+\phi3)}, -e^{j(\phi1+\phi2)}, e^{j(\phi1)}\}$.

5. The method of claim 1, wherein the vector is an eight element complex vector, and wherein the first portion of the vector comprises a first four elements of the eight element complex vector, and wherein the second portion of the vector comprises a last four elements of the eight element complex vector.

6. A method comprising:
receiving a waveform representing a wireless communication;
demodulating the waveform into a vector of encoded data;
calculating partial correlation values for portions of the vector, the calculating comprising
calculating a first set of partial correlation values for a first portion of a vector, the first set being a subset of a total number of possible correlation values for the first portion of the vector; and
calculating a second set of partial correlation values for a second portion of the vector, the second set being a subset of a total number of possible correlation values for the second portion of the vector; and
decoding transmitted data from the vector based on the partial correlation value,
wherein the sets of partial correlation values include real and imaginary components, the method further comprising
for each partial correlation value, identifying a largest coefficient magnitude;
storing a sign associated with each largest coefficient magnitude;
storing whether each largest coefficient magnitude corresponds to real or imaginary components;
identifying a pair of partial correlation values having a greatest combined largest coefficient magnitude, wherein the pair is associated with one partial correlation value from each of the two sets of partial correlation values; and
calculating the largest correlation value for the vector based on the identified pair, signs associated with the largest coefficient magnitudes of the partial correlation values in the identified pair, and whether each of the largest coefficient magnitudes of the partial correlation values in the identified pair corresponded to real or imaginary components.

7. A demodulator for a wireless communication device comprising:
a demodulation unit that demodulates a received waveform representing a wireless communication into a vector of encoded data;
a first partial correlator that calculates a first set of partial correlation values for a first portion of the vector against a first set of complex conjugates of first portions of a plurality of possible code words;
a second partial correlator that calculates a second set of partial correlation values for a second portion of the vector against a second set of complex conjugates of second portions of the plurality of possible code words;
a correlation combiner that calculates a largest correlation value associated with the vector based at least in part on the calculations of the first and second sets of partial correlation values; and
a selector that selects a most probable code word associated with the largest correlation value.

8. The demodulator of claim 7, wherein the vector represents data from a waveform having redundancy characteristics.

9. The demodulator of claim 8, wherein the waveform is a complimentary code keying (CCK) waveform for an IEEE 802.11b standard synthesized from a CCK equation set:
$\{e^{j(\phi1+\phi2+\phi3+\phi4)}, e^{j(\phi1+\phi3+\phi4)}, e^{j(\phi1+\phi2+\phi4)}, -e^{j(\phi1+\phi4)}, e^{j(\phi1+\phi2+\phi3)}, e^{j(\phi1+\phi3)}, -e^{j(\phi1+\phi2)}, e^{j(\phi1)}\}$.

10. The demodulator of claim 7, wherein the first set is a subset of a total number of possible correlation values for the first portion of the vector, and the second set is a subset of a total number of possible correlation values for the second portion of the vector.

11. The demodulator of claim 7, wherein the demodulator forms part of a wireless communication device selected from the group of wireless communication devices consisting of: a desktop computer, a laptop computer, a mobile phone, a personal digital assistant, a hand-held data terminal, a handheld data collection device, an interactive television, a network ready appliance, a wireless router, a wireless server, and an Internet kiosk.

12. The demodulator of claim 7, wherein the vector is an eight element complex vector, and wherein the first portion of the vector comprises a four element complex vector and wherein the second portion of the vector comprises another four element complex vector.

13. The demodulator of claim 12, wherein the first portion of the vector comprises a first four elements of the eight element complex vector, and wherein the second portion of the vector comprises a last four elements of the eight element complex vector.

14. A demodulator for a wireless communication device comprising:
a demodulation unit that demodulates a received waveform representing a wireless communication into a vector of encoded data;
a first partial correlator that calculates a first set of partial correlation values for a first portion of the vector, the first set being a subset of a total number of possible correlation values for the first portion of the vector;
a second partial correlator that calculates a second set of partial correlation values for a second portion of the vector, the second set being a subset of a total number of possible correlation values for the second portion of the vector; and
a correlation combiner that calculates a largest correlation value associated with the vector based at least in part on the calculations of the first and second sets of partial correlation values,
wherein the sets of partial correlation values include real and imaginary components, and wherein
the partial correlators identify a largest coefficient magnitude for each partial correlation value, store an indication of a sign associated with each largest coefficient magnitude and store an indication of whether each largest coefficient magnitude corresponds to real or imaginary components; and
wherein the correlation combiner identifies a pair of partial correlation values having a greatest combined largest coefficient magnitude, wherein the pair is associated with one partial correlation value from each of the two sets of partial correlation values, and calculates the largest correlation value for the vector based on the identified pair, signs associated with the largest coefficient magnitudes of the partial correlation values in the identified pair, and whether each of the largest coefficient magnitudes of the partial correlation values in the identified pair corresponded to real or imaginary components.

15. A computer readable medium having executable instructions for controlling a demodulator within a wireless communication device, wherein the instructions cause the demodulator to:
   demodulate a received waveform representing a wireless communication into a vector of encoded data;
   calculate a first set of partial correlation values for a first portion of the vector against a first set of complex conjugates of first portions of a plurality of possible code words;
   calculate a second set of partial correlation values for a second portion of the vector against a second set of complex conjugates of second portions of the plurality of possible code words;
   determine a largest correlation value associated with the vector based at least in part on the calculations of the first and second sets of partial correlation values; and
   select a most probable code word associated with the largest correlation value.

16. A computer readable medium having executable instructions for controlling a demodulator within a wireless communication device, wherein the instructions cause the demodulator to:
   demodulate a received waveform representing a wireless communication into a vector of encoded data;
   calculate a first set of partial correlation values for a first portion of the vector;
   calculate a second set of partial correlation values for a second portion of the vector, wherein pairs of partial correlation values are defined by one partial correlation value from each of the first and second sets of partial correlation values;
   for each partial correlation value identify a largest coefficient magnitude;
   store a sign associated with each largest coefficient magnitude;
   store whether each largest coefficient magnitude corresponds to real or imaginary components;
   identify a pair of partial correlation values having a greatest combined largest coefficient magnitude;
   determine a largest correlation value for the vector based on the identified pair, signs associated with the largest coefficient magnitudes of the partial correlation values in the identified pair, and whether each of the largest coefficient magnitudes of the partial correlation values in the identified pair correspond to real or imaginary components; and
   select a most probable code word associated with the largest correlation value.

17. A method of determining a code word transmitted within a wireless waveform comprising:
   demodulating the waveform into a vector of encoded data;
   calculating a subset of a total number of possible cross-correlation values associated with a first portion of the vector against a first set of complex conjugates of first portions of a plurality of possible code words;
   calculating a subset of a total number of possible cross-correlation values associated with a second portion of the vector against a second set of complex conjugates of second portions of the plurality of possible code words; and
   determining the code word using at least the subsets.

18. The method of claim 17, wherein determining the code word using at least the subsets comprises:
   identifying a pair of partial correlation values having a greatest combined largest coefficient magnitude;
   identifying signs associated with largest coefficient magnitudes that make up the greatest combined larges coefficient magnitude; and
   identifying whether largest coefficient magnitudes that make up the greatest combined largest coefficient magnitude correspond to real or imaginary components.

19. The method of claim 18, wherein the method is performed in the order it is recited.

20. An apparatus comprising:
   means for demodulating a received waveform representing a wireless communication into a vector of encoded data;
   means for calculating a first set of partial correlation values for a first portion of the vector against a first set of complex conjugates of first portions of a plurality of possible code words;
   means for calculating a second set of partial correlation values for a second portion of the vector against a second set of complex conjugates of second portions of the plurality of possible code words;
   means for calculating a largest correlation value associated with the vector based at least in part on the calculations of the first and second sets of partial correlation values; and
   means for selecting a most probable code word associated with the largest correlation value.

21. An apparatus comprising:
   means for receiving a waveform representing a wireless communication;
   means for demodulating the waveform into a vector of encoded data;
   means for calculating a first set of partial correlation values for a first portion of the vector against a first set of complex conjugates of first portions of a plurality of possible code words;
   means for calculating a second set of partial correlation values for a second portion of the vector against a second set of complex conjugates of second portions of the plurality of possible code words; and
   means for decoding transmitted data from the vector based on the partial correlation values wherein the means for decoding comprises means for calculating a largest correlation value associated with the vector based at least in part on the calculations of the first and second sets of partial correlation values and means for selecting a most probable code word associated with the largest correlation value.

22. A wireless communication device comprising:
   a receiver that receives a waveform representing a wireless communication; and
   a demodulator coupled to the receiver that includes:
   a demodulation unit that demodulates the received waveform into a vector of encoded data;
   a first partial correlator that calculates a first set of partial correlation values for a first portion of the vector against a first set of complex conjugates of first portions of a plurality of possible code words;
   a second partial correlator that calculates a second set of partial correlation values for a second portion of the vector against a second set of complex conjugates of second portions of the plurality of possible code words;
   a correlation combiner that calculates a largest correlation value associated with the vector based at least in part on the calculations of the first and second sets of partial correlation values;

a selector that selects a most probable code word associated with the largest correlation value.

23. The wireless communication device of claim 22, wherein the first set is a subset of a total number of possible correlation values for the first portion of the vector, and the second set is a subset of a total number of possible correlation values for the second portion of the vector.

24. A wireless communication device comprising:
a receiver that receives a waveform representing a wireless communication; and
a demodulator coupled to the receiver that includes:
a demodulation unit that demodulates the received waveform into a vector of encoded data;
a first partial correlator that calculates a first set of partial correlation values for a first portion of the vector, the first set being a subset of a total number of possible correlation values for the first portion of the vector;
a second partial correlator that calculates a second set of partial correlation values for a second portion of the vector, the second set being a subset of a total number of possible correlation values for the second portion of the vector; and
a correlation combiner that calculates a largest correlation value associated with the vector based at least in part on the calculations of the first and second sets of partial correlation values,
wherein the sets of partial correlation values include real and imaginary components, and wherein
the partial correlators identify a largest coefficient magnitude for each partial correlation value, store an indication of a sign associated with each largest coefficient magnitude and store an indication of whether each largest coefficient magnitude corresponds to real or imaginary components; and
wherein the correlation combiner identifies a pair of partial correlation values having a greatest combined largest coefficient magnitude, wherein the pair is associated with one partial correlation value from each of the two sets of partial correlation values, and calculates the largest correlation value for the vector based on the identified pair, signs associated with the largest coefficient magnitudes of the partial correlation values in the identified pair, and whether each of the largest coefficient magnitudes of the partial correlation values in the identified pair corresponded to real or imaginary components.

25. A system comprising:
a memory; and
a processor coupled to the memory that executes instructions to:
demodulate a received waveform representing a wireless communication into a vector of encoded data;
calculate a first set of partial correlation values for a first portion of the vector against a first set of complex conjugates of first portions of a plurality of possible code words;
calculate a second set of partial correlation values for a second portion of the vector against a second set of complex conjugates of second portions of the plurality of possible code words;
calculate a largest correlation value associated with the vector based at least in part on the calculations of the first and second sets of partial correlation values; and
select a most probable code word associated with the largest correlation value.

26. The system of claim 25, wherein the first set is a subset of a total number of possible correlation values for the first portion of the vector, and the second set is a subset of a total number of possible correlation values for the second portion of the vector.

27. A system comprising:
a memory; and
a processor coupled to the memory that executes instructions to:
demodulate a received waveform representing a wireless communication into a vector of encoded data;
calculate a first set of partial correlation values for a first portion of the vector, the first set being a subset of a total number of possible correlation values for the first portion of the vector;
calculate a second set of partial correlation values for a second portion of the vector, the second set being a subset of a total number of possible correlation values for the second portion of the vector; and
calculate a largest correlation value associated with the vector based at least in part on the calculations of the first and second sets of partial correlation values,
wherein the sets of partial correlation values include real and imaginary components, and wherein the processor executes instructions to
identify a largest coefficient magnitude for each partial correlation value, store in the memory an indication of a sign associated with each largest coefficient magnitude and store in the memory an indication of whether each largest coefficient magnitude corresponds to real or imaginary components; and
identify a pair of partial correlation values having a greatest combined largest coefficient magnitude, wherein the pair is associated one partial correlation value from each of the two sets of partial correlation values, and calculate the largest correlation value for the vector based on the identified pair, signs associated with the largest coefficient magnitudes of the partial correlation values in the identified pair, and whether each of the largest coefficient magnitudes of the partial correlation values in the identified pair corresponded to real or imaginary components.

* * * * *